(12) United States Patent
Park et al.

(10) Patent No.: US 11,379,022 B2
(45) Date of Patent: Jul. 5, 2022

(54) MOBILE TERMINAL

(71) Applicant: LG ELECTRONICS INC., Seoul (KR)

(72) Inventors: Kyungui Park, Seoul (KR); Byungsun Kim, Seoul (KR); Wook Kim, Seoul (KR); Joseph Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/967,713

(22) PCT Filed: Mar. 14, 2018

(86) PCT No.: PCT/KR2018/002966
§ 371 (c)(1),
(2) Date: Aug. 5, 2020

(87) PCT Pub. No.: WO2019/160189
PCT Pub. Date: Aug. 22, 2019

(65) Prior Publication Data
US 2021/0041926 A1 Feb. 11, 2021

(30) Foreign Application Priority Data
Feb. 14, 2018 (KR) .................... 10-2018-0018754

(51) Int. Cl.
*G06F 1/20* (2006.01)
*H05K 1/02* (2006.01)
(Continued)

(52) U.S. Cl.
CPC ........... *G06F 1/203* (2013.01); *H04B 1/3827* (2013.01); *H05K 1/0203* (2013.01);
(Continued)

(58) Field of Classification Search
CPC ...... G06F 1/203; G06F 1/1626; G06F 1/1656; H05K 1/0203; H05K 7/20336;
(Continued)

(56) References Cited

U.S. PATENT DOCUMENTS 9,629,268 B2 * 4/2017 Lee ...................... H05K 5/0247
2011/0176279 A1 * 7/2011 Zhao .................... H01L 23/4093
361/720
(Continued)

FOREIGN PATENT DOCUMENTS

KR 20130008924 1/2013
KR 20140000933 1/2014
(Continued)

OTHER PUBLICATIONS

Lee, Hae Jin, "Electronic Device with Thermal Spreader", Aug. 28, 2017, Samsung Electronics Co Ltd., Entire Document (Translation of KR 20170097541)(of record, cited in IDS, including Original Copy). (Year: 2017).*
(Continued)

*Primary Examiner* — Stephen S Sul
(74) *Attorney, Agent, or Firm* — Lee Hong Degerman Kang & Waimey

(57) ABSTRACT

The present invention relates to a mobile terminal comprising: a terminal body; a circuit board mounted inside the terminal body; an electronic device mounted on one surface of the circuit board; a shield can provided on the circuit board so as to surround the electronic device and shielding electromagnetic waves generated from the electronic device; a metal plate coupled to the shield can and made of a material having high thermal conductivity; and a heat pipe which is positioned to face the shield can with the metal plate interposed therebetween and has a flow path to accommodate a fluid at a center portion thereof, wherein the metal
(Continued)

plate and the heat pipe are integrally formed, and heat generated in the electronic device can be transmitted to the heat pipe through the metal plate.

7 Claims, 10 Drawing Sheets

(51) Int. Cl.
    *H05K 9/00*         (2006.01)
    *H05K 7/20*         (2006.01)
    *H04B 1/3827*     (2015.01)

(52) U.S. Cl.
    CPC ....... *H05K 7/2039* (2013.01); *H05K 7/20336* (2013.01); *H05K 9/0081* (2013.01)

(58) Field of Classification Search
    CPC ............... H05K 7/2039; H05K 9/0081; H05K 2201/064; H05K 2201/10128; H05K 2201/10371; H05K 1/0272; H04B 1/036; H04B 1/3888
    See application file for complete search history.

(56) References Cited

U.S. PATENT DOCUMENTS

| | | | | |
|---|---|---|---|---|
| 2015/0342089 A1* | 11/2015 | Kim | ................ | H05K 7/20336 |
| | | | | 361/700 |
| 2016/0128227 A1* | 5/2016 | Gernert | ............ | H05K 7/20336 |
| | | | | 165/104.21 |
| 2017/0155746 A1* | 6/2017 | Yang | ................ | H05K 7/20509 |
| 2017/0163302 A1* | 6/2017 | Saeidi | ................ | H04B 1/385 |
| 2017/0290209 A1* | 10/2017 | Craig | ................ | H01L 23/552 |
| 2017/0322600 A1* | 11/2017 | Nguyen | ................ | C09K 5/14 |
| 2018/0007783 A1* | 1/2018 | Crotty, Jr | ........... | H05K 1/0216 |
| 2018/0139874 A1* | 5/2018 | Bruzda | ................ | H05K 1/0201 |
| 2018/0254237 A1* | 9/2018 | Kulkarni | ............ | F28D 15/0275 |

FOREIGN PATENT DOCUMENTS

| | | |
|---|---|---|
| KR | 20150114374 | 10/2015 |
| KR | 20150135955 | 12/2015 |
| KR | 20170097541 | 8/2017 |

OTHER PUBLICATIONS

PCT International Application No. PCT/KR2018/002966, International Search Report dated Oct. 31, 2018, 2 pages.

* cited by examiner

|                          | Related art | Present invention |
|--------------------------|-------------|-------------------|
| Front-surface temperature | 28.5 ℃     | 23.3 ℃           |
| Rear-surface temperature  | 24.3 ℃     | 23.6 ℃           |

MOBILE TERMINAL

CROSS-REFERENCE TO RELATED APPLICATIONS

This application is the National Stage filing under 35 U.S.C. 371 of International Application No. PCT/KR2018/002966, filed on Mar. 14, 2018, which claims the benefit of earlier filing date and right of priority to Korean Application No. 10-2018-0018754, filed on Feb. 14, 2018, the contents of which are all hereby incorporated by reference herein in their entirety.

BACKGROUND

1. Technical Field

The present disclosure relates to a structure of a mobile terminal with improved heat dissipation performance.

2. Description of the Related Art

Terminals may be classified into mobile/portable terminals and stationary terminals according to their mobility. Furthermore, mobile terminals may be divided into hand-held terminals and vehicle mounted terminals according to whether or not it can be directly carried by a user.

The terminal has various functions according to the development of technologies. The terminal may be implemented in the form of a multimedia player with various functions such capturing pictures or videos, playing music or video files, playing games, receiving broadcast, and the like, and the improvement of structural or software elements of the terminal may be taken into consideration in order to support and enhance the functions of the terminal.

In recent years, as the design of the terminal has been gradually simplified and its thickness becomes thinner, it is important to effectively cool heat generated from electronic devices mounted on a circuit board provided inside the terminal, in particular, from a main processor (application processor, AP).

In particular, when various functions of the terminal are used at the same time, the electronic device generates a large amount of heat due to the processing of a large amount of data, and when the heat is not quickly cooled, not only the performance of the electronic device may be deteriorated, but also the generated heat may be transferred to the user, causing a problem of discomfort.

In order to solve this, in the related art, a heat dissipation material is typically located between the electronic device and a shield can to be in direct contact therewith so as to cool the electronic device. However, cooling the circuit board and the electronic device through the heat dissipation material has an insignificant effect, and has a problem in that the structure of the terminal is complicated.

Accordingly, there is a need for a mobile terminal capable of more efficiently dissipating heat generated from the electronic device so as to maintain the performance of the mobile terminal and improve durability by changing the internal structure of the mobile terminal.

SUMMARY

The present disclosure is intended to solve the foregoing problems and other problems, and is to provide a structure of a mobile terminal capable of effectively dissipating heat generated from an electronic device.

The present disclosure is to provide a structure of a mobile terminal capable of minimizing a change in the internal structure of the mobile terminal, and securing heat dissipation performance without increasing its overall thickness.

In order to achieve the foregoing objectives of the present disclosure, a mobile terminal according to the present disclosure may include a terminal body; a circuit board provided inside the terminal body; an electronic device mounted on one surface of the circuit board; a shield can provided on the circuit board to surround the electronic device so as to shield electromagnetic waves generated from the electronic device; a metal plate coupled to the shield can and composed of copper or a copper alloy; and a heat pipe positioned to face the shield can with the metal plate interposed therebetween, and provided with a passage to accommodate fluid in a central portion thereof, wherein the metal plate and the heat pipe are integrally formed to transfer heat generated from the electronic device to the heat pipe through the metal plate.

Here, the metal plate and the heat pipe may be coupled to each other by a low-temperature soldering portion.

A first heat transfer member may be positioned between the electronic device and the metal plate to allow the electronic device and the metal plate to be in close contact with each other, and a second heat transfer member that couples the metal plate and the inner frame may be positioned between the metal plate and the heat pipe.

In addition, a mobile terminal according to the present disclosure may include a terminal body; an inner frame provided inside the terminal body to support a rear surface of the terminal body; a first circuit board provided inside the terminal body, and mounted with electronic devices mounted on both sides thereof; a second circuit board spaced apart from the first circuit board by a predetermined distance and disposed in parallel to the first circuit board, and mounted with an electronic device mounted on one surface thereof; an interposer that couples the first and second circuit boards between the first and second circuit boards; a plurality of shield cans formed to cover each of the electronic devices; a metal plate having a horizontal portion extended from side portions of the first and second circuit boards in a direction intersecting the first and second circuit boards, and a horizontal portion bent at one end of the vertical portion and then extended in contact with each shield can; and a heat pipe one surface of which is provided in contact with the metal plate, and the other surface of which is provided in contact with the inner frame, wherein the metal plate and the heat pipe are integrally formed to be coupled by a low-temperature soldering portion so as to absorb heat generated from the each electronic device.

In a mobile terminal having the foregoing structure, heat generated from electronic devices may be transferred to a heat pipe through a metal plate, thereby preventing performance degradation due to the temperature rise of the electronic devices through maintaining heat dissipation performance.

Furthermore, at least part of a shield can may be replaced with a metal plate to absorb heat generated from electronic devices by the metal plate, thereby transferring heat to a heat pipe through the metal plate.

In addition, in the case of a structure in which a plurality of circuit boards are stacked, heat generated from electronic devices mounted on each circuit board may be sufficiently dissipated through a heat pipe disposed adjacent to each circuit board by bending a metal plate, and brought into contact with different points of the metal plate.

DETAILED DESCRIPTION OF THE EMBODIMENTS

Figure 1A:
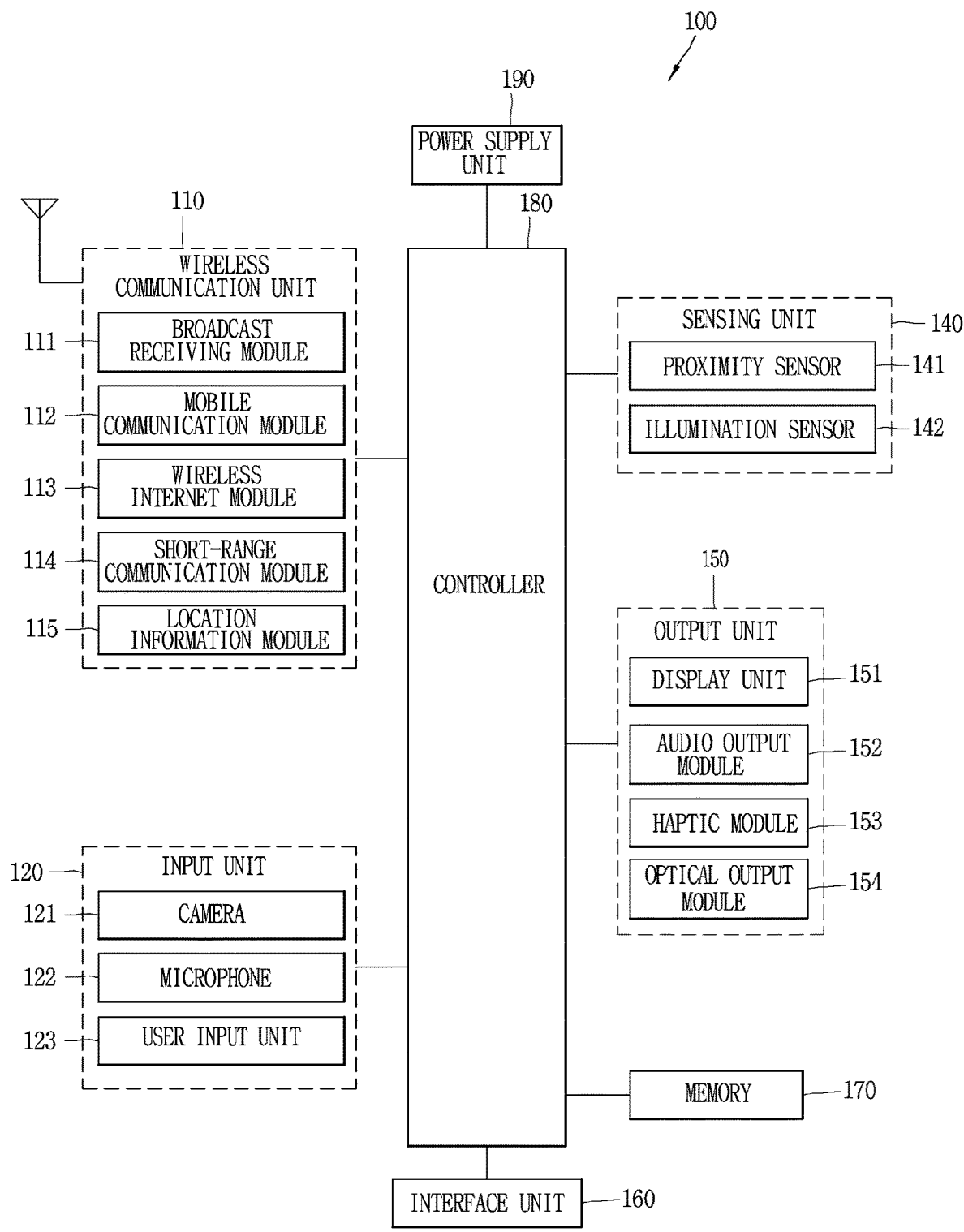
FIG. 1A is a block diagram for explaining a mobile terminal according to the present disclosure.

Hereinafter, preferred embodiments of the present disclosure will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the present disclosure, moreover, the detailed description will be omitted when a specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

FIG. 1A is a block diagram for explaining an electronic apparatus 100 associated with the present disclosure.

The electronic apparatus 100 may include a wireless communication unit 110, an input unit 120, a sensing unit 140, an output unit 150, an interface unit 160, a memory 170, a controller 180, and a power supply unit 190. The components illustrated in FIG. 1 are not essential for implementing the electronic apparatus 100, and thus the electronic apparatus 100 described herein may have more or fewer components than those listed above.

In more detail, the wireless communication unit 110 of those components may typically include one or more modules which permit wireless communications between the electronic apparatus 100 and a wireless communication system, between the electronic apparatus 100 and another mobile terminal, or between the electronic apparatus 100 and an external server. In addition, the wireless communication unit 110 may include one or more modules for connecting the electronic apparatus 100 to one or more networks.

The wireless communication unit 110 may include at least one of a broadcast receiving module 111, a mobile communication module 112, a wireless Internet module 113, a short-range communication module 114, a location information module 115 and the like.

The input unit 120 may include a camera 121 for inputting an image signal, a microphone 122 or an audio input module for inputting an audio signal, or a user input unit 123 (for example, a touch key, a push key (or a mechanical key), etc.) for allowing a user to input information. Audio data or image data collected by the input unit 120 may be analyzed and processed by a user's control command.

The sensing unit 140 is typically implemented using one or more sensors configured to sense internal information of the electronic apparatus 100, the surrounding environment of the electronic apparatus 100, user information, and the like. For example, the sensing unit 140 may include a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, refer to the camera 121), a microphone 122, a battery gage, an environment sensor (for example, a barometer, a hygrometer, a thermometer, a radiation detection sensor, a thermal sensor, a gas sensor, etc.), and a chemical sensor (for example, an electronic nose, a health care sensor, a biometric sensor, etc.). On the other hand, the mobile terminal disclosed herein may utilize information in such a manner of combining information sensed by at least two sensors of those sensors.

The output unit 150 may be configured to output an audio signal, a video signal or a tactile signal. The output unit 150 may include a display module 151, an audio output module 152, a haptic module 153, an optical output unit 154 and the like. The display module 151 may have an inter-layered structure or an integrated structure with a touch sensor in order to facilitate a touch screen. The touch screen may provide an output interface between the electronic apparatus 100 and a user, as well as functioning as the user input unit 123 which provides an input interface between the electronic apparatus 100 and the user.

The interface unit 160 serves as an interface with various types of external devices that can be coupled to the electronic apparatus 100. The interface unit 160, for example, may include wired or wireless headset ports, external power supply ports, wired or wireless data ports, memory card ports, ports for connecting a device having an identification module, audio input/output (I/O) ports, video I/O ports, earphone ports, or the like. The electronic apparatus 100 may execute an appropriate control related to a connected external device, in response to the external device being connected to the interface unit 160.

In addition, the memory 170 stores data supporting various functions of the electronic apparatus 100. For instance, the memory 170 may be configured to store application programs executed in the electronic apparatus 100, data or instructions for operations of the electronic apparatus 100, and the like. At least some of those application programs may be downloaded from an external server via wireless communication. Some others of those application programs may be installed within the electronic apparatus 100 at the time of being shipped for basic functions of the electronic apparatus 100 (for example, receiving a call, placing a call, receiving a message, sending a message, etc.). On the other hand, the application programs may be stored in the memory 170, installed in the electronic apparatus 100, and executed by the controller 180 to perform an operation (or a function) of the electronic apparatus 100.

The controller 180 may typically control an overall operation of the electronic apparatus 100 in addition to the operations related to the application programs. The controller 180 may provide or process information or functions appropriate for a user in a manner of processing signals, data, information and the like, which are input or output by the aforementioned components, or activating the application programs stored in the memory 170.

Furthermore, the controller 180 may control at least part of the components illustrated in FIG. 1A, in order to drive the application programs stored in the memory 170. In addition, the controller 180 may drive the application programs by combining at least two of the components included in the electronic apparatus 100 for operation.

The power supply unit 190 may receive external power or internal power and supply appropriate power required for operating respective elements and components included in the electronic apparatus 100 under the control of the controller 180. The power supply unit 190 may include a battery, and the battery may be an embedded battery or a replaceable battery.

At least part of those elements and components may be combined to implement operation and control of the electronic apparatus 100 or a control method of the electronic apparatus 100 according to various exemplary embodiments described herein. Furthermore, the operation and control or the control method of the electronic apparatus 100 may be implemented in the mobile terminal in such a manner of activating at least one application program stored in the memory 170.

Hereinafter, each aforementioned component will be described in more detail with reference to FIG. 1, prior to explaining various exemplary embodiments implemented by the electronic apparatus 100 having the configuration.

First, the wireless communication unit 110 will be described. The broadcast receiving module 111 of the wireless communication unit 110 may receive a broadcast signal and/or broadcast associated information from an external broadcast managing entity via a broadcast channel. The broadcast channel may include a satellite channel and/or a terrestrial channel. At least two broadcast receiving modules 111 may be provided in the electronic apparatus 100 to simultaneously receive at least two broadcast channels or switch the broadcast channels.

The mobile communication module 112 may transmit/receive wireless signals to/from at least one of network entities, for example, a base station, an external terminal, a server, and the like, on a mobile communication network, which is constructed according to technical standards or transmission methods for mobile communications (for example, Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), etc.)

Here, the wireless signals may include audio call signal, video (telephony) call signal, or various formats of data according to transmission/reception of text/multimedia messages.

The wireless Internet module 113 refers to a module for supporting wireless Internet access, and may be built-in or externally installed on the electronic apparatus 100. The wireless Internet module 113 may transmit and/or receive wireless signals via communication networks according to wireless Internet technologies.

Examples of such wireless Internet access may include Wireless LAN (WLAN), Wireless-Fidelity (Wi-Fi), Wireless Fidelity Direct (Wi-Fi Direct), Digital Living Network Alliance (DLNA), Wireless Broadband (WiBro), World Interoperability for Microwave Access (WiMAX), High Speed Downlink Packet Access (HSDPA), High Speed Uplink Packet Access (HSUPA), LTE (Long Term Evolution), LTE-A (Long Term Evolution-Advanced), and the like. The wireless Internet module 113 may transmit/receive data according to at least one wireless Internet technology within a range including even Internet technologies which are not aforementioned.

From the perspective that the wireless Internet accesses according to Wibro, HSDPA, GSM, CDMA, WCDMA, LTE, LTE-A and the like are executed via a mobile communication network, the wireless Internet module 113 which performs the wireless Internet access via the mobile communication network may be understood as a type of the mobile communication module 112.

The short-range communication module 114 denotes a module for short-range communications. Suitable technologies for implementing the short-range communications may include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, and the like. The short-range communication module 114 may support wireless communications between the electronic apparatus 100 and a wireless communication system, between the electronic apparatus 100 and another mobile terminal, or between the electronic apparatus 100 and a network where another mobile terminal (or an external server) is located, via a wireless personal area network. The short-range communication module 114 denotes a module for short-range communications.

Here, the another mobile terminal may be a wearable device, for example, a smart watch, smart glasses or a head mounted display (HMD), which is able to exchange data with the electronic apparatus 100 (or to link data with the electronic apparatus 100). The short-range communication module 114 may sense (recognize) a wearable device, which is able to communicate with the electronic apparatus 100), near the electronic apparatus 100. In addition, when the sensed wearable device is a device which is authenticated to communicate with the electronic apparatus 100 according to the present disclosure, the controller 180 may transmit at least part of data processed in the electronic apparatus 100 to the wearable device via the short-range communication module 114. Hence a user of the wearable device may use the data processed in the electronic apparatus 100 on the wearable device. For example, when a call is received in the electronic apparatus 100, the user may answer the call using the wearable device. Also, when a message is received in the electronic apparatus 100, the user can check the received message using the wearable device.

The location information module 115 is generally configured to detect, calculate, derive or otherwise identify a position of the electronic apparatus 100. As an example, the location information module 115 includes a Global Position System (GPS) module, a Wi-Fi module, or both. For example, when the electronic apparatus 100 uses the GPS module, a position of the electronic apparatus 100 may be acquired using a signal sent from a GPS satellite. As another example, when the electronic apparatus 100 uses the Wi-Fi module, a position of the electronic apparatus 100 may be acquired based on information related to a wireless access point (AP) which transmits or receives a wireless signal to or from the Wi-Fi module. According to the need, the location information module 115 may perform any function of the other modules of the wireless communication unit 110 to obtain data on the location of the electronic apparatus 100. As a module used to acquire the location (or current location) of the electronic apparatus 100, the location information module 115 may not be necessarily limited to a module for directly calculating or acquiring the location of the electronic apparatus 100.

The input unit 120 may be configured to provide an audio or video signal (or information) input or information input by a user. For the input of the audio information, the electronic apparatus 100 may include one or a plurality of cameras 121. The camera 121 processes a image frame, such as still picture or video, acquired by an image sensor in a video phone call or image capturing mode. The processed image frames may be displayed on the display module 151. On the other hand, the plurality of cameras 121 disposed in the electronic apparatus 100 may be arranged in a matrix configuration. By use of the cameras 121 having the matrix configuration, a plurality of image information having various angles or focal points may be input into the electronic apparatus 100. As another example, the cameras 121 may be located in a stereoscopic arrangement to acquire left and right images for implementing a stereoscopic image.

The microphone 122 may process an external audio signal into electric audio data. The processed audio data may be utilized in various manners according to a function being executed in the electronic apparatus 100 (or an application program being executed). On the other hand, the microphone 122 may include assorted noise removing algorithms to remove noise generated in the course of receiving the external audio signal.

The user input unit 123 may receive information input by a user. When information is input through the user input unit 123, the controller 180 may control an operation of the electronic apparatus 100 to correspond to the input information. The user input unit 123 may include one or more of a mechanical input element (for example, a key, a button located on a front and/or rear surface or a side surface of the electronic apparatus 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

On the other hand, the sensing unit 140 may sense at least one of internal information of the electronic apparatus 100, surrounding environment information of the electronic apparatus 100 and user information, and generate a sensing signal corresponding to it. The controller 180 may control an operation of the electronic apparatus 100 or execute data processing, a function or an operation related to an application program installed in the electronic apparatus 100 based on the sensing signal. Hereinafter, description will be given in more detail of representative sensors of various sensors which may be included in the sensing unit 140.

First, a proximity sensor 141 refers to a sensor to sense presence or absence of an object approaching to a surface to be sensed, or an object disposed near a surface to be sensed, by using an electromagnetic field or infrared rays without a mechanical contact. The proximity sensor 141 may be arranged at an inner region of the electronic apparatus 100 covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 may sense proximity of a pointer to the touch screen by changes of an electromagnetic field, which is responsive to an approach of an object with conductivity. In this case, the touch screen (touch sensor) may also be categorized as a proximity sensor.

On the other hand, for the sake of brief explanation, a behavior in which the pointer is positioned to be proximate onto the touch screen without contact will be referred to as "proximity touch," whereas a behavior in which the pointer substantially comes into contact with the touch screen will be referred to as "contact touch." For the position corresponding to the proximity touch of the pointer on the touch screen, such position will correspond to a position where the pointer faces perpendicular to the touch screen upon the proximity touch of the pointer. The proximity sensor 141 may sense proximity touch, and proximity touch patterns (e.g., distance, direction, speed, time, position, moving status, etc.). On the other hand, the controller 180 may process data (or information) corresponding to the proximity touches and the proximity touch patterns sensed by the proximity sensor 141, and output visual information corresponding to the process data on the touch screen. In addition, the controller 180 may control the electronic apparatus 100 to execute different operations or process different data (or information) according to whether a touch with respect to the same point on the touch screen is either a proximity touch or a contact touch.

A touch sensor can sense a touch applied to the touch screen, such as display module 151, using any of a variety of touch methods. Examples of such touch methods include a resistive type, a capacitive type, an infrared type, and a magnetic field type, among others.

As one example, the touch sensor may be configured to convert changes of pressure applied to a specific part of the display module 151 or a capacitance occurring from a specific part of the display module 151, into electric input signals. The touch sensor may be configured to detect a position, an area where a touch object applying a touch onto the touch screen is touched on the touch sensor, a pressure at the time of touch, a capacitance at the time of touch, and the like. Here, the touch object body may be a finger, a touch pen or stylus pen, a pointer, or the like as an object through which a touch is applied to the touch sensor.

When a touch input is sensed by a touch sensor, corresponding signals may be transmitted to a touch controller. The touch controller may process the received signals, and then transmit corresponding data to the controller 180. Accordingly, the controller 180 may sense which region of the display module 151 has been touched. Here, the touch controller may be a component separate from the controller 180 or the controller 180 itself.

On the other hand, the controller 180 may execute a different control or the same control according to a type of an object which touches the touch screen (or a touch key provided in addition to the touch screen). Whether to execute the different control or the same control according to the object which gives a touch input may be decided based on a current operating state of the electronic apparatus 100 or a currently executed application program.

Meanwhile, the touch sensor and the proximity sensor may be executed individually or in combination, to sense various types of touches, such as a short (or tap) touch, a long touch, a multi-touch, a drag touch, a flick touch, a pinch-in touch, a pinch-out touch, a swype touch, a hovering touch, and the like.

An ultrasonic sensor may be configured to recognize position information relating to a sensing object by using ultrasonic waves. Meanwhile, the controller 180 may calculate the location of a wave generating source through information sensed from the optical sensor and the plurality of ultrasonic sensors. Since light is much faster than ultrasonic waves, a time for which the light reaches the optical sensor may be much shorter than a time for which the ultrasonic wave reaches the ultrasonic sensor. The position of the wave generation source may be calculated using the fact. In more detail, the position of the wave generation source may be calculated by using a time difference from the time that the ultrasonic wave reaches based on the light as a reference signal.

The camera 121 constructing the input unit 120 may be a type of camera sensor. The camera sensor may include at least one of a photo sensor (or image sensor) and a laser sensor.

The camera 121 and the laser sensor may be combined with each other to detect a touch of the sensing object with respect to a 3D stereoscopic image. The camera 121 and the laser sensor may be combined to detect a touch of the sensing object with respect to a 3D stereoscopic image. More specifically, the photo sensor is integrated with photo diodes and transistors in the rows and columns thereof, and a content placed on the photo sensor may be scanned by using an electrical signal that is changed according to the amount of light applied to the photo diode. Namely, the photo sensor may calculate the coordinates of the sensing object according to variation of light to thus obtain position information of the sensing object.

The display module 151 may display (output) information processed in the electronic apparatus 100. For example, the display module 151 may display execution screen information of an application program driven in the electronic apparatus 100 or user interface (UI) and graphic user interface (GUI) information in response to the execution screen information.

Furthermore, the display module 151 may also be implemented as a stereoscopic display module for displaying stereoscopic images.

The stereoscopic display module may employ a stereoscopic display scheme such as stereoscopic scheme (a glass scheme), an auto-stereoscopic scheme (glassless scheme), a projection scheme (holographic scheme), or the like.

The audio output unit 152 may output audio data received from the wireless communication unit 110 or stored in the memory 160 in a call signal reception mode, a call mode, a record mode, a voice recognition mode, a broadcast reception mode, and the like. Also, the audio output unit 152 may also provide audible output signals related to a particular function (e.g., a call signal reception sound, a message reception sound, etc.) performed by the electronic apparatus 100. The audio output module 152 may include a receiver, a speaker, a buzzer or the like.

A haptic module 153 may generate various tactile effects the that user may feel. A typical example of the tactile effect generated by the haptic module 153 may be vibration. Strength, pattern and the like of the vibration generated by the haptic module 153 may be controllable by a user selection or setting of the controller. For example, the haptic module 153 may output different vibrations in a combining manner or a sequential manner.

Besides vibration, the haptic module 153 may generate various other tactile effects, including an effect by stimulation such as a pin arrangement vertically moving with respect to a contact skin, a spray force or suction force of air through a jet orifice or a suction opening, a touch on the skin, a contact of an electrode, electrostatic force, etc., an effect by reproducing the sense of cold and warmth using an element that can absorb or generate heat, and the like.

The haptic module 153 may be configured to transmit tactile effects through a user's direct contact, or a user's muscular sense using a finger or a hand. The haptic module 153 may be implemented in two or more in number according to the configuration of the electronic apparatus 100.

An optical output module 154 may output a signal for indicating an event generation using light of a light source of the electronic apparatus 100. Examples of events generated in the electronic apparatus 100 may include a message reception, a call signal reception, a missed call, an alarm, a schedule notice, an email reception, an information reception through an application, and the like.

A signal output by the optical output module 154 may be implemented in such a manner that the electronic apparatus 100 emits monochromatic light or light with a plurality of colors. The signal output may be terminated as the electronic apparatus 100 senses that a user has checked the generated event, for example.

The interface unit 160 serves as an interface for external devices to be connected with the electronic apparatus 100. The interface unit 160 may allow a data reception from an external device, a power delivery to each component in the electronic apparatus 100, or a data transmission from the electronic apparatus 100 to an external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

On the other hand, the identification module may be configured as a chip for storing various information required to authenticate an authority to use the electronic apparatus 100, which may include a User Identity Module (UIM), a Subscriber Identity Module (SIM), and the like. A device having the identification module (hereinafter, an "identification device") may be fabricated in the form of a smart card. Accordingly, the identifying device may be connected with the electronic apparatus 100 via the interface unit 160.

The interface unit 160 may serve as a path for power to be supplied from an external cradle to the electronic apparatus 100 when the electronic apparatus 100 is connected to the external cradle or as a path for transferring various command signals inputted from the cradle by a user to the electronic apparatus 100. Such various command signals or power inputted from the cradle may operate as signals for recognizing that the electronic apparatus 100 has accurately been mounted to the cradle.

The memory 170 can store programs to support operations of the controller 180 and store input/output data (for example, phonebook, messages, still images, videos, etc.). The memory 170 may store data related to various patterns of vibrations and audio which are output in response to touch inputs on the touch screen.

The memory 170 may include at least one type of storage medium including a Flash memory, a hard disk, a multimedia card micro type, a card-type memory (e.g., SD or DX memory, etc.), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, and an optical disk. Also, the electronic apparatus 100 may operate in association with a web storage which performs the storage function of the memory 170 on the Internet.

As aforementioned, the controller 180 may typically control the general operations of the electronic apparatus 100. For example, the controller 180 may set or release a locked state a lock state for restricting a user from inputting a control command with respect to applications when a state of the electronic apparatus 100 meets a preset condition.

Furthermore, the controller 180 may also perform controlling and processing associated with voice calls, data communications, video calls, and the like, or perform pattern recognition processing to recognize a handwriting input or a picture drawing input performed on the touch screen as characters or images, respectively. In addition, the controller 180 may control one or combination of those components in order to implement various exemplary embodiment disclosed herein on the electronic apparatus 100.

The power supply unit 190 may receive external power or internal power and supply appropriate power required for operating respective elements and components under the control of the controller 180. The power supply unit 190 may include a battery, which is typically rechargeable or be detachably coupled to the terminal body for charging.

Furthermore, the power supply unit 190 may include a connection port. The connection port may be configured as one example of the interface unit 160 to which an external (re)charger for supplying power to recharge the battery is electrically connected.

As another example, the power supply unit 190 may be configured to recharge the battery in a wireless manner without use of the connection port. Here, the power supply unit 190 may receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable or its similar medium using, for example, software, hardware, or any combination thereof.

Hereinafter, a structure of an electronic apparatus 100 according to an embodiment of the present disclosure as described above in FIG. 1A or the terminal in which the above-described components are disposed will be described with reference to FIGS. 1B and 10.

Figure 1B:
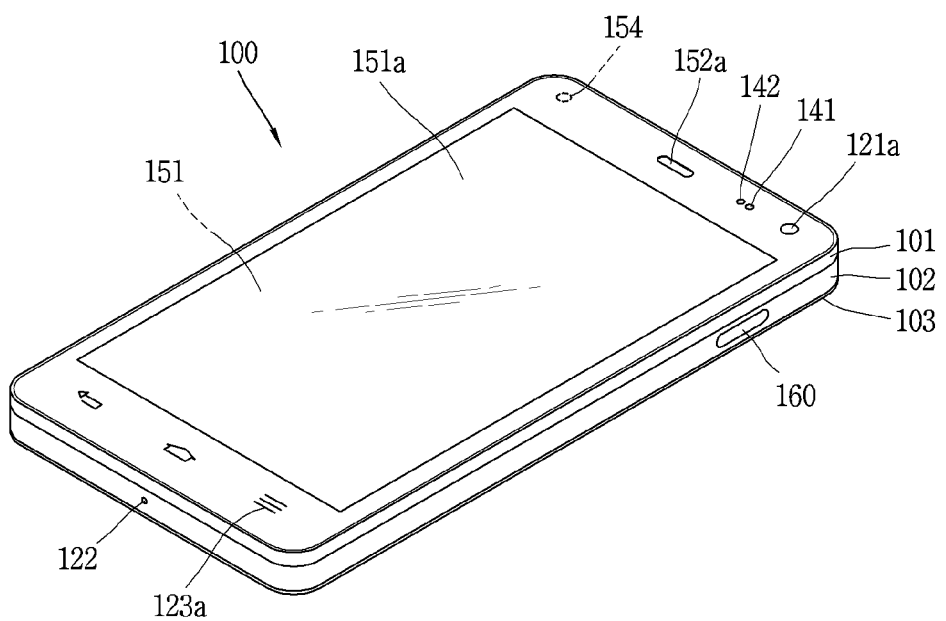
FIG. 1B is a perspective view showing a shape of a front portion of the mobile terminal.
Figure 1C:
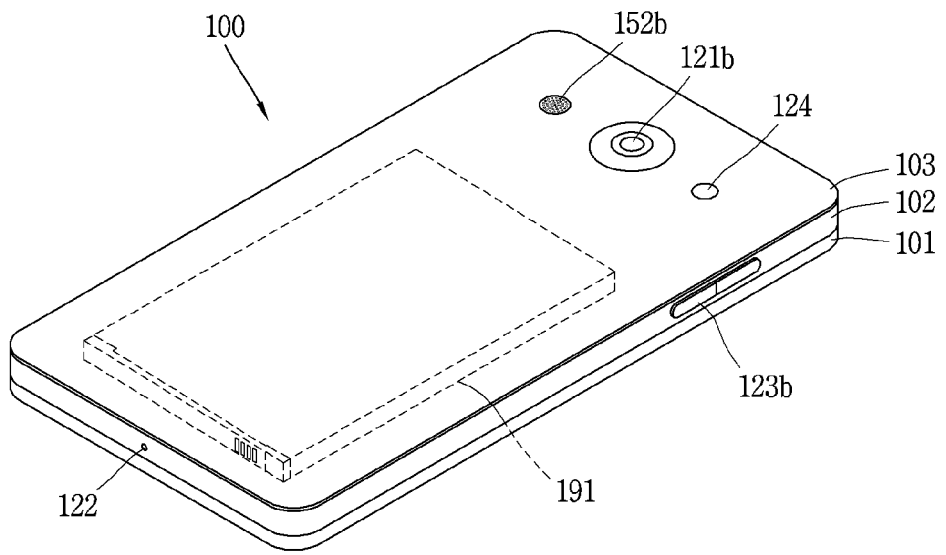
FIG. 1O is a perspective view showing a shape of a rear portion of the mobile terminal.
Figure 10:
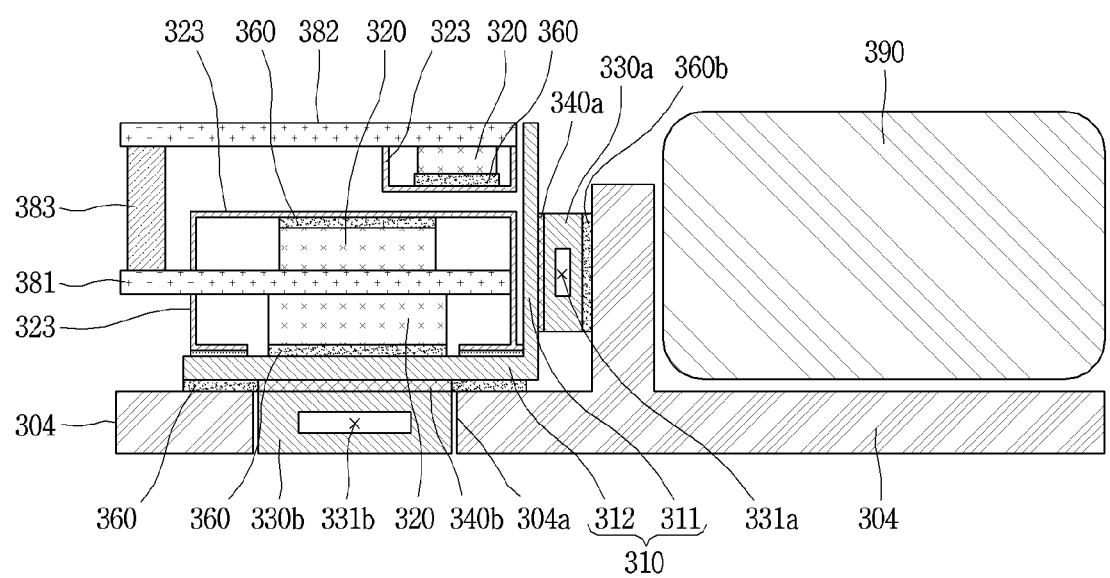
FIG. 10 is a view showing a shape of a mobile terminal showing another embodiment of the present disclosure.

Referring now to FIGS. 1B and 10, the electronic apparatus 100 is described with reference to a bar-type terminal body. However, the present disclosure may not be necessarily limited to this, and may be also applicable to various structures such as a watch type, a clip type, a glasses type, a folder type in which two or more bodies are coupled to each other in a relatively movable manner, a slide type, a swing type, a swivel type, and the like. The following description in association with a specific type of mobile terminal or on a specific type of mobile terminal will be also typically applied to another type of mobile terminal.

Here, the terminal body may be understood as a conception which indicates the electronic apparatus 100 as at least one assembly.

The electronic apparatus 100 may include a case (for example, a body, a frame, a housing, a cover, etc.) constituting the appearance thereof. As illustrated in the drawing, the electronic apparatus 100 may include a front case 101 and a rear case 102. Various electronic components may be incorporated into a space formed between the front case 101 and the rear case 102. At least one middle case may be additionally disposed between the front case 101 and the rear case 102

A display module 151 may be disposed on a front surface of the terminal body to output information. As illustrated, a window 151a of the display module 151 may be mounted to the front case 101 so as to form the front surface of the terminal body together with the front case 101.

In some cases, electronic components may also be mounted to the rear case 102. Examples of those electronic components mounted to the rear case 102 may include a detachable battery, an identification module, a memory card and the like. Here, a rear cover 103 for covering the electronic components mounted may be detachably coupled to the rear case 102. Therefore, when the rear cover 103 is detached from the rear case 102, the electronic components mounted to the rear case 102 may be externally exposed.

As illustrated, when the back cover 103 is coupled to the rear case 102, a side surface of the rear case 102 may be partially exposed. In some cases, upon the coupling, the rear case 102 may also be completely shielded by the rear cover 300. On the other hand, the back cover 103 may include an opening portion for exposing the camera 121b or the audio output module 152b to the outside.

The cases 101, 102, 103 may be formed by injection-molding synthetic resin or may be formed of a metal, for example, stainless steel (STS), aluminum (Al), titanium (Ti), or the like.

Unlike the example which the plurality of cases form an inner space for accommodating such various components, the electronic apparatus 100 may be configured such that one case forms the inner space. In this example, the electronic apparatus 100 having a uni-body formed in such a manner that synthetic resin or metal extends from a side surface to a rear surface may also be implemented.

On the other hand, the electronic apparatus 100 may include a waterproofing unit (not shown) for preventing an introduction of water into the terminal body. For example, the waterproof portion may include a waterproof member provided between the window 151a and the front case 101, between the front case 101 and the rear case 102, or between the rear case 102 and the back cover 103, to hermetically seal an inner space when those cases are coupled to each other.

The electronic apparatus 100 may include a display module 151, first and second audio output modules 152a and 152b, a proximity sensor 141, an illumination sensor 152, an optical output module 154, first and second cameras 121a and 121b, first and second manipulation units 123a and 123b, a microphone 122, an interface unit 160 and the like.

Hereinafter, description will be given of an exemplary electronic apparatus 100 that the display module 151, the first audio output module 152a, the proximity sensor 141, the illumination sensor 142, the optical output module 154, the first camera 121a and the first manipulation unit 123a are disposed on the front surface of the terminal body, the second manipulation unit 123b, the microphone 122 and the interface unit 160 are disposed on a side surface of the terminal body, and the second audio output module 152b and the second camera 121b are disposed on a rear surface of the terminal body, with reference to FIGS. 1B and 10.

However, the foregoing configuration may not be necessarily limited to the arrangement. The foregoing configuration may be excluded, substituted or disposed on another surface if necessary. For example, the first manipulation unit 123a may not be disposed on the front surface of the terminal body, and the second audio output module 152b may be disposed on the side surface other than the rear surface of the terminal body.

The display module 151 may display (output) information processed in the electronic apparatus 100. For example, the display module 151 may display execution screen information of an application program driven in the electronic apparatus 100 or user interface (UI) and graphic user interface (GUI) information in response to the execution screen information.

The display module 151 may include at least one of a liquid crystal display (LCD), a thin film transistor-liquid crystal display (TFT-LCD), an organic light emitting diode (OLED), a flexible display, a 3-dimensional (3D) display, and an e-ink display.

The display module 151 may be implemented in two or more in number according to a configured aspect of the electronic apparatus 100. For instance, a plurality of the display modules 151 may be arranged on one surface to be spaced apart from or integrated with each other, or may be arranged on different surfaces in the electronic apparatus 100.

The display module 151 may include a touch sensor which senses a touch onto the display module 151 so as to receive a control command in a touching manner. When a touch is input to the display module 151, the touch sensor may be configured to sense this touch and the controller 180 may generate a control command corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

In this manner, the display module 151 may form a flexible touch screen along with the touch sensor, and in this case, the touch screen may function as the user input unit 123 (refer to FIG. 1A). Therefore, the touch screen may replace at least some of the functions of the first manipulation unit 123a. Hereinafter, for convenience of explanation, the display unit (display module) for outputting the image and the touch sensor are collectively referred to as a touch screen 151.

The first audio output module 152a may be implemented in the form of a receiver for transferring voice sounds to the user's ear or a loud speaker for outputting various alarm sounds or multimedia reproduction sounds.

The window 151a of the display module 151 may include a sound hole for emitting sounds generated from the first audio output module 152a. Here, the present disclosure may not be limited to this. It may also be configured such that the sounds are released along an assembly gap between the structural bodies (for example, a gap between the window 151a and the front case 101). In this case, a hole independently formed to output audio sounds may not be seen or hidden in terms of appearance, thereby further simplifying the appearance of the electronic apparatus 100.

The optical output module 154 may output light for indicating an event generation. Examples of the event may include a message reception, a call signal reception, a missed call, an alarm, a schedule notice, an email reception, information reception through an application, and the like. When a user's event check is sensed, the controller 180 may control the optical output unit 154 to end the output of light.

The first camera 121a may process video frames such as still or moving images acquired by the image sensor in a video call mode or a capture mode. The processed video frames may be displayed on the display module 151 or stored in the memory 170.

The first and second manipulation units 123a and 123b are examples of the user input unit 123, which may be manipulated by a user to input a command for controlling the operation of the electronic apparatus 100. The first and second manipulation units 123a and 123b may employ any method if it is a tactile manner allowing the user to perform manipulation with a tactile feeling such as touch, push, scroll or the like. In addition, the first and second manipulation units 123a and 123b may also employ a method of allowing the user to perform manipulation without a tactile feeling through a proximity touch, a hovering touch, or the like.

The drawings are illustrated on the basis that the first manipulation unit 123a is a touch key, but the present disclosure may not be necessarily limited to this. For example, the first manipulation unit 123a may be configured with a mechanical key, or a combination of a touch key and a push key.

The content received by the first and second manipulation units 123a and 123b may be set in various ways. For example, the first manipulation unit 123a may be used by the user to input a command such as menu, home key, cancel, search, or the like, and the second manipulation unit 123b may be used by the user to input a command, such as controlling a volume level being output from the first or second audio output module 152a or 152b, switching into a touch recognition mode of the display module 151, or the like.

On the other hand, as another example of the user input unit 123, a rear input unit (not shown) may be disposed on the rear surface of the terminal body. The rear input unit may be manipulated by a user to input a command for controlling an operation of the electronic apparatus 100. The content input may be set in various ways. For example, the rear input unit may be used by the user to input a command, such as power on/off, start, end, scroll or the like, controlling a volume level being output from the first or second audio output module 152a or 152b, switching into a touch recognition mode of the display module 151, or the like. The rear input unit may be implemented into a form allowing a touch input, a push input or a combination thereof.

The rear input unit may be disposed to overlap with the display module 151 of the front surface in a thickness direction of the terminal body. As one example, the rear input unit may be disposed on an upper end portion of the rear surface of the terminal body such that a user can easily manipulate it using a forefinger when the user grabs the terminal body with one hand. However, the present disclosure may not be limited to this, and the position of the rear input unit may be changeable.

When the rear input unit is disposed on the rear surface of the terminal body, a new user interface may be implemented using the rear input unit. Also, the aforementioned touch screen or the rear input unit may substitute for at least part of functions of the first manipulation unit 123a located on the front surface of the terminal body. Accordingly, when the first manipulation unit 123a is not disposed on the front surface of the terminal body, the display module 151 may be implemented to have a larger screen.

On the other hand, the electronic apparatus 100 may include a fingerprint recognition sensor for recognizing a user's fingerprint, and the controller 180 may use fingerprint information sensed through the finger recognition sensor as an authentication means. The finger scan sensor may be installed in the display module 151 or the user input unit 123.

The microphone 122 may be formed to receive the user's voice, other sounds, and the like. The microphone 122 may be provided at a plurality of places, and configured to receive stereo sounds.

The interface unit 160 may serve as a path allowing the electronic apparatus 100 to exchange data with external devices. For example, the interface unit 160 may be at least one of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the electronic apparatus 100. The interface unit 160 may be implemented in the form of a socket for accommodating an external card, such as Subscriber Identification Module (SIM), User Identity Module (UIM), or a memory card for information storage.

The second camera 121b may be further mounted to the rear surface of the terminal body. The second camera 121b may have an image capturing direction, which is substantially opposite to the direction of the first camera unit 121a.

The second camera 121b may include a plurality of lenses arranged along at least one line. The plurality of lenses may also be arranged in a matrix configuration. The cameras may be referred to as an 'array camera.' When the second camera 121b is implemented as the array camera, images may be captured in various manners using the plurality of lenses and images with better qualities may be obtained.

A flash 124 may be disposed adjacent to the second camera 121b. When an image of a subject is captured with the camera 121b, the flash 124 may illuminate the subject.

The second audio output module 152b may further be disposed on the terminal body. The second audio output module 152b may implement a stereo function in conjunction with the first audio output module 152a, and may be also used to implement a speakerphone mode during a call.

At least one antenna for wireless communication may be disposed on the terminal body. The antenna may be installed in the terminal body or formed on the case. For example, an antenna which configures a part of the broadcast receiving module 111 (see FIG. 1A) may be retractable into the terminal body. Alternatively, an antenna may be formed in a form of film to be attached onto an inner surface of the rear cover 300 or a case including a conductive material may serve as an antenna.

A power supply unit 190 (refer to FIG. 1A) for supplying power to the electronic apparatus 100 may be disposed on the terminal body. The power supply unit 190 may include a batter 191 which is mounted in the terminal body or detachably coupled to an outside of the terminal body.

The battery 191 may receive power via a power source cable connected to the interface unit 160. Furthermore, the battery 191 may be (re)chargeable in a wireless manner using a wireless charger. The wireless charging may be implemented by magnetic induction or electromagnetic resonance.

On the other hand, the drawing illustrates that the back cover 103 is coupled to the rear case 102 for shielding the battery 191, so as to prevent separation of the battery 191 and protect the battery 191 from an external impact or foreign materials. When the battery 191 is detachable from the terminal body, the rear case 300 may be detachably coupled to the rear case 102.

An accessory for protecting an appearance or assisting or extending the functions of the electronic apparatus 100 can also be provided on the electronic apparatus 100. As one example of an accessory, a cover or pouch for covering or accommodating at least one surface of the electronic apparatus 100 may be provided. The cover or pouch may cooperate with the display module 151 to extend the function of the electronic apparatus 100. Another example of the accessory may be a touch pen for assisting or extending a touch input onto a touch screen.

Hereinafter, in the present specification, for example, a mobile terminal will be described as an example of the electronic apparatus 100 described above.

Figure 2:
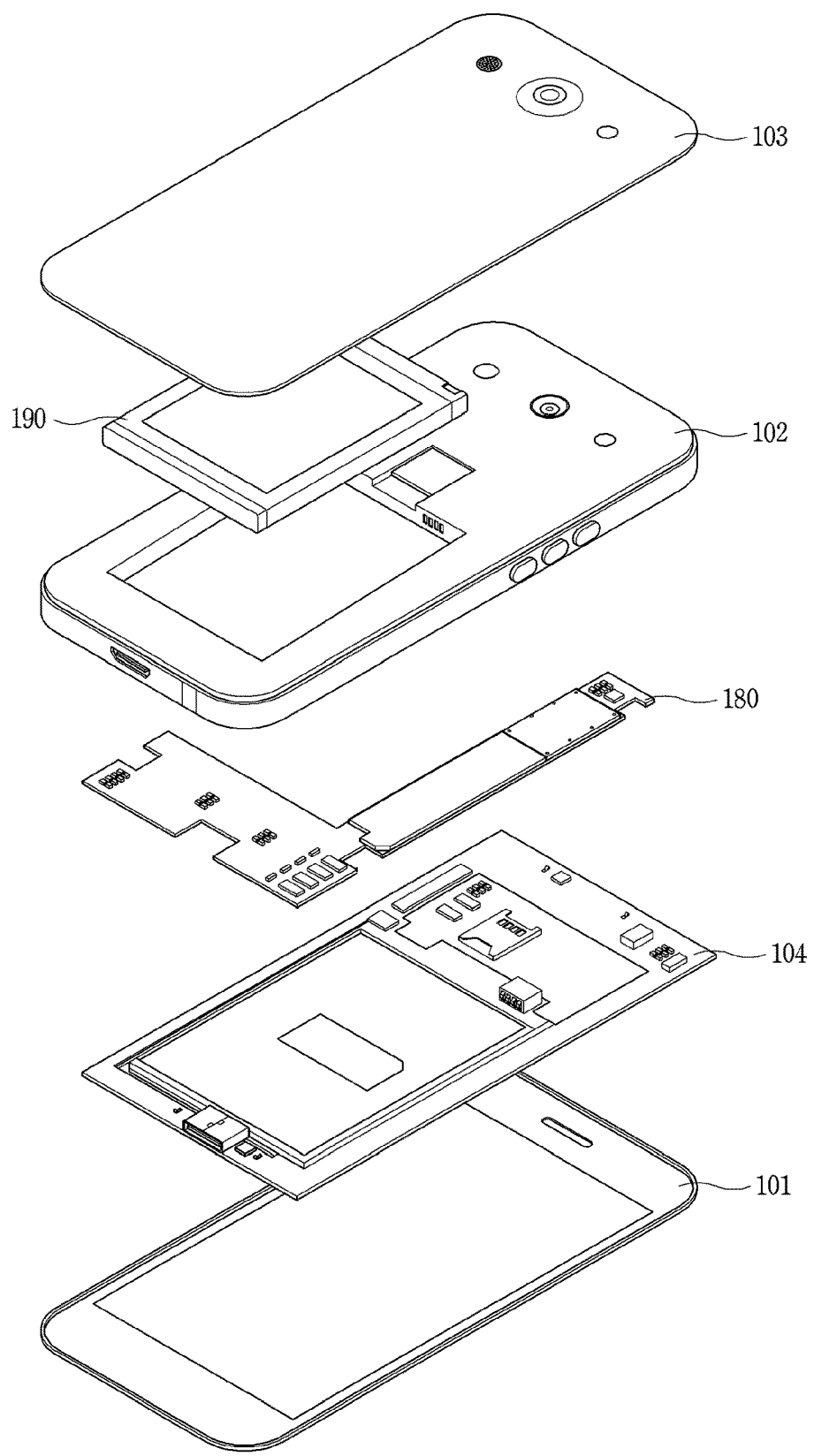
FIG. 2 is an exploded view of a mobile terminal according to the present disclosure.

FIG. 2 shows an exploded view in which the mobile terminal 100 according to the present invention is disassembled.

A space is formed inside the mobile terminal 100 by a front case 101 and a rear case 102, and a back cover 103 is coupled to the rear case 102. An accommodation space for mounting a battery 190 may be formed on one side of the rear case 102. The back cover 103 may be mounted on the rear case 102 so as to cover the battery 190.

An inner frame 104 is disposed inside the rear case 102. A display module 151 is coupled to one side of the inner frame 104, and a circuit board 180 is provided on the other side of the inner frame 104. The circuit board 180 may be formed not to overlap with the battery 190.

A plurality of electronic devices 220 (see FIG. 3) including a drive chip (not shown) may be arranged on the circuit board 180, and a shield can 223 (see FIG. 4) may be provided on the electronic devices 220 to cover them The shield can 223 (see FIG. 3) may be formed in plurality to cover each electronic device 220 (see FIG. 3) individually. The shield can 200 may receive electromagnetic waves emitted by the operation of the electronic devices 220 to emit them to a ground region of the circuit board 180 (see FIG. 3), thereby performing the role of preventing electromagnetic waves from being radiated to an outer space of the shield can.

The circuit board 180 is provided inside the mobile terminal 100, and heat is generated from the electronic devices 220 (see FIG. 3) mounted on the circuit board 180 according to the operation of the mobile terminal. In particular, high heat is generated from a main chip (application processor) among the electronic devices 220, and when heat generated due to large data processing is not efficiently dissipated, performance degradation such as chip dead may occur.

In addition, when heat is continuously generated from a specific portion of the mobile terminal 200, component damage may occur, and heat is transferred directly to a users hand, causing the users discomfort.

Accordingly, the mobile terminal 200 according to the present disclosure has a structure including a metal plate 210 and a heat pipe 230 to effectively dissipate heat generated from an electronic device that is internally positioned therein. The detailed description thereof will be described later.

Figure 3:
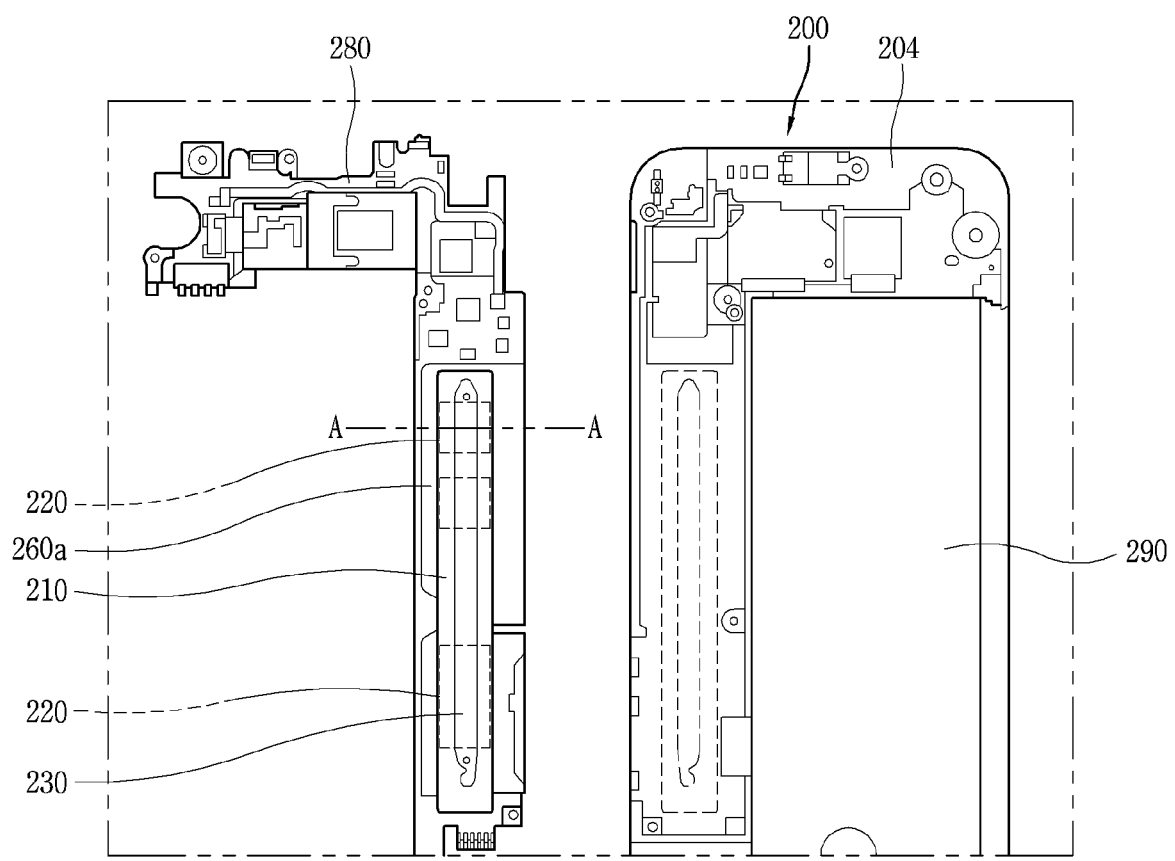
FIG. 3 is a view showing a shape in which a circuit board is separated from an inner frame.

FIG. 3 is a view showing an internal appearance of the mobile terminal 200 according to the present disclosure, showing a shape in which a circuit board 280 is separated from an internal frame 204.

The left side view of FIG. 3 shows a shape in which the metal plate 210 and the heat pipe 230 are provided on the circuit board 280, and the right-side view thereof shows a shape of the inner frame 204.

The circuit board 280 is provided with an electronic device 220 and a shield can 223 provided to surround the electronic device 220. The shield can 223 serves to shield electromagnetic waves generated from the electronic device 220. Due to the operation of the mobile terminal 200, high heat is generated from the electronic device 220 mounted on the circuit board 280. In order to effectively dissipate such heat, the mobile terminal 200 according to the present disclosure has a structure in which the metal plate 210 is provided adjacent to the electronic device 220 mounted on the circuit board 280, and the heat pipe 230 is coupled to the metal plate 210. In other words, heat generated from the electronic device 220 is transferred to the metal plate 210 through a heat transfer member 260a, and transferred to the heat pipe 230 coupled to the metal plate 210, thereby effectively discharging heat generated from the electronic device 220 through the inner frame 204, which is positioned in contact with the heat pipe 230.

As seen from the right-side view of FIG. 3, the inner frame 204 is disposed behind the display module to support the display module, and serves to maintain the rigidity of the mobile terminal 200. The inner frame 204 includes a metal material such as aluminum or magnesium to secure rigidity. An insulating coating for preventing electrical conduction may be formed on a surface of the inner frame 204.

At this time, when high heat is applied to the battery 290, there is a risk of explosion, so the metal plate 210 and the heat pipe 230 may be preferably disposed in a lateral direction of the battery 290 to be spaced apart from the battery 290.

Figure 4:
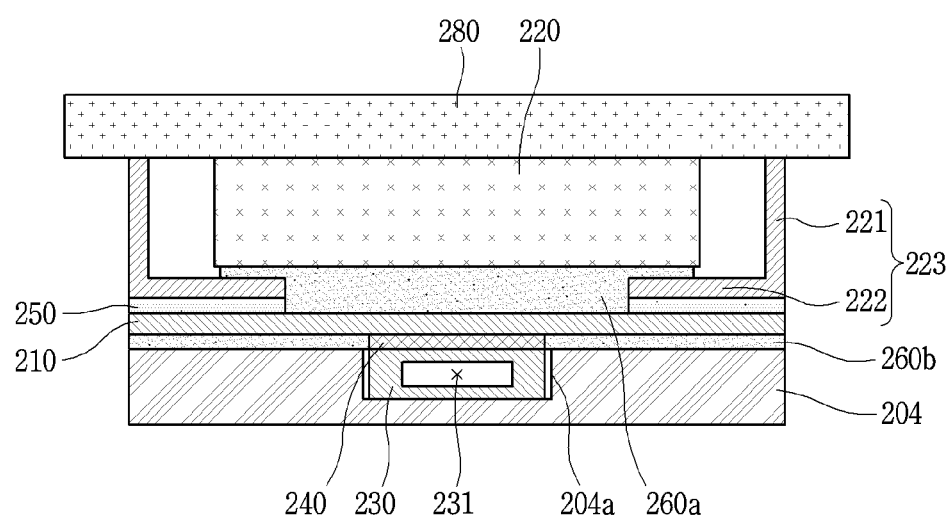
FIG. 4 is a cross-sectional view taken along line A-A when the circuit board and the inner frame in FIG. 3 are coupled to each other.

FIG. 4 is a cross-sectional view taken along line A-A when the circuit board 280 and the internal frame 204 of FIG. 3 are coupled to each other.

The electronic device 220 is mounted on one surface of the circuit board 280 provided inside the terminal body, and the shield can 223 provided on the circuit board 280 to surround the electronic device 220 to shield electromagnetic waves generated from the electronic device 220 is provided. The shield can 223 includes a sidewall portion 221 vertically provided on the circuit board 280 and a shield portion 222 extending from the sidewall portion 221 and disposed in parallel to the circuit board 280.

The electronic device 220 provided on the circuit board 280 may denote an application processor (AP) for processing and calculating data or a power amplifier module (PAM) for converting and supplying power, and a lot of heat is generated in the process of processing data and power due to the operation of the mobile terminal 200. When the electronic device 220 exceeds a predetermined temperature due to heat generated therefrom, the performance thereof may be deteriorated or, in severe cases, the electronic device 220 may be damaged by thermal runaway. In addition, heat generated from each electronic device 220 is transferred to the circuit board 280, which may cause discomfort to the user due to high temperature.

In the case of the mobile terminal 200 according to the present disclosure, it has a structure capable of transferring heat generated from the electronic device 220 to the metal plate 210. The metal plate 210 is positioned under the shield can 223, and the metal plate 210 is formed in a rectangular plate shape having a constant thickness to correspond to an upper surface (shielding portion 222) of the shield can 223.

The metal plate 210 is preferably made of a material containing copper (Cu) to have high thermal conductivity. Specifically, the metal plate may be made of copper or copper alloy. For example, the copper alloy may be composed of a Cu—Ni—Si-based copper alloy C70250 (or C7025), which includes 2.2 to 4.2% by weight of nickel (Ni), 0.25 to 1.20% by weight of silicon (Si), 0.05 to 0.30% by weight of magnesium (Mg), and copper (Cu) forming the remainder to enhance conductivity, and may include 2.5 to 6.0% by weight of nickel (Ni), 0.4 to 1.5% by weight of silicon (Si), and 0.003 to 0.5% by weight of titanium (Ti) to improve strength and electrical conductivity. However, this is only an example, and the constituent material will not be limited as long as maintaining thermal conductivity.

The metal plate 210 may be coupled through the shield portion 222 of the shield can 223 and the conductive tape 250. The metal plate 210 is configured to have one surface in contact with the shield can 223, and the other surface in contact with the heat pipe 230.

In addition, the present disclosure may also allow the metal plate 210 to be configured to constitute part of the upper surface 222 of the shield can 223. Here, part of the upper surface 222 may denote part of the upper surface 222 that is cut open.

A first heat transfer member 260a may be disposed between the electronic device 220 and the metal plate 210 to bring the electronic device 220 and the metal plate 210 into close contact with each other and increase the contact area.

The first heat transfer member 260a may be made of a material having a high thermal conductivity of approximately 1 to 3 W/mk, and may denote a member in a gel, grease, or paste phase. Furthermore, the first heat transfer member 260a may be composed of a PCM (phase change material) sheet in which a phase change to a liquid phase occurs when reaching a constant temperature to fill a fine air layer between the electronic device 220 and the metal plate 210 so as to improve heat transfer performance.

The first heat transfer member 260a increases an area of contact between the metal plate 210 and the electronic device 220, and serves to efficiently transfer heat discharged from the electronic device 220 to the metal plate 210.

The heat pipe 230 is positioned to be spaced apart from the shield can 223 by a predetermined distance, and absorbs heat generated from the electronic device 220 to transfer heat in contact with the inner frame 204.

The heat pipe 230 is formed in a plate shape having a constant thickness, and a passage 231 capable of moving working fluid is formed in a central portion thereof. The working fluid absorbs heat from the metal plate 210, and when the temperature becomes higher than the boiling point, the phase changes to a gas phase. The working fluid undergoes a phase change to a liquid phase at a temperature below the boiling point.

The metal plate 210 and the heat pipe 230 may be coupled to each other by a low-temperature soldering portion 240. The soldering method couples two members to each other using a solder paste made of a liquid or paste (semi-liquid) phase metal material, and has a strong bonding strength and high thermal conductivity because there is no vacant gap between the two members. When using a low-temperature soldering method capable of soldering work even at low temperatures using a solder paste alloyed with tin and a metal that melts at a low temperature, the metal plate 210 and the metal plate 210 may be coupled to each other without damage to the passage 231 formed in a central portion of the heat pipe 230. The melting point of the low-temperature soldering portion 240 is approximately 135 degrees, and the thermal conductivity is 19 W/mk. The low-temperature soldering portion may be made of a copper alloy.

In addition, as shown in FIG. 4, a groove portion 204a may be formed in the inner frame 204 to accommodate the heat pipe 230 therein. The groove portion 204a may be formed to have a width and depth corresponding to those of the heat pipe 230. As described above, when the heat pipe 230 is accommodated in the groove portion 204a of the inner frame 204, it may be possible to prevent an increase in thickness due to the heat pipe 230 as well as to increase a contact area between the heat pipe 230 and the inner frame, thereby increasing the amount of heat transferred from the heat pipe 230 to the inner frame 204.

A second heat transfer member 260b is positioned between the metal plate 210 and the inner frame 204 to enable heat transfer between the metal plate 210 and the inner frame 204. The second heat transfer member 260b is positioned in a space between the metal plate 210 and the heat pipe 230.

The second heat transfer member 260b may be made of a material having a high thermal conductivity of approximately 1 to 3 W/mk, similar to the first heat transfer member 260a described above, and may denote a member in a gel or paste phase. Furthermore, the second heat transfer member 260b may be composed of a PCM (phase change material) sheet in which a phase change to a liquid phase occurs when reaching a constant temperature to fill a fine air layer between the metal plate 210 and the inner frame 204 so as to improve heat transfer performance. The second heat transfer member 260b may increase a contact area between the metal plate 210 and the inner frame 204 to more efficiently transfer heat discharged to the inner frame 204.

Figures 5A, 5B:
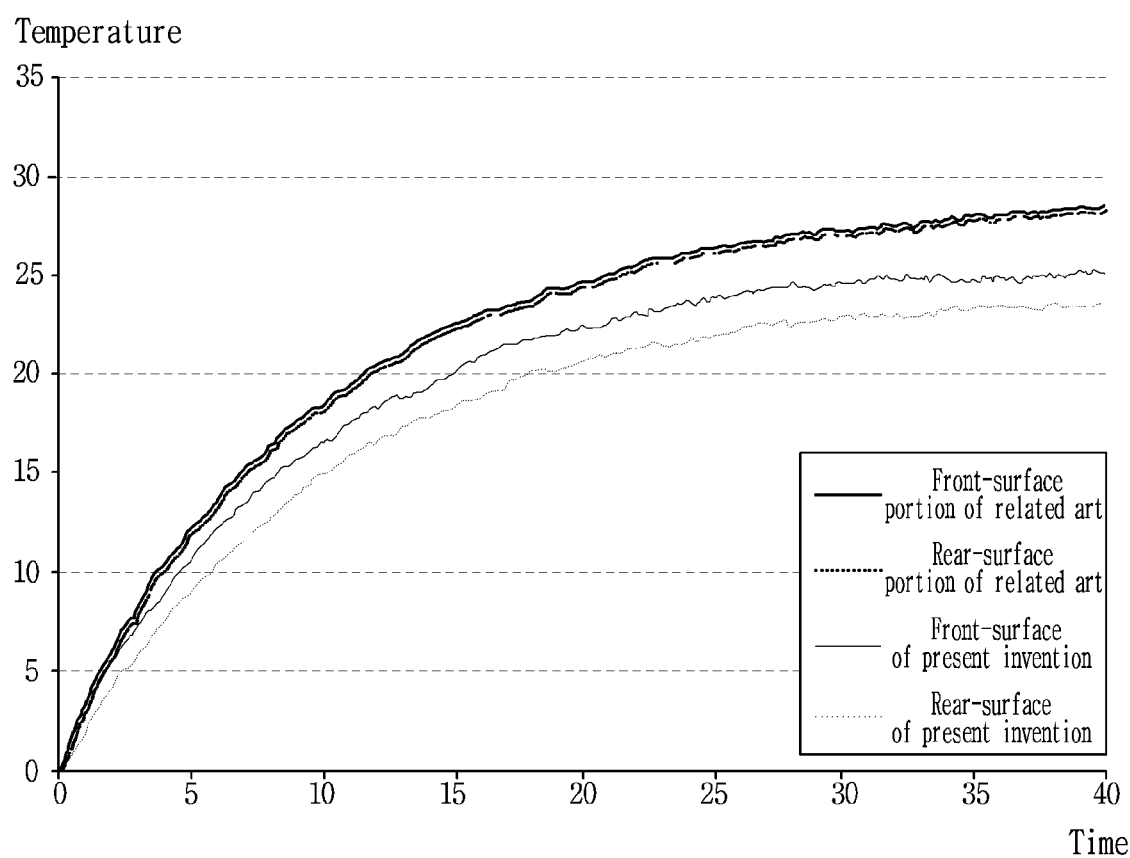
FIG. 5A is data showing values of surface temperatures on the front and rear surfaces of a mobile terminal for the present disclosure and the relate art.
FIG. 5B is a graph showing temperature distributions over time on the front and rear surfaces of a mobile terminal for the present disclosure and the related art.

FIG. 5A shows values measured at specific points on front and rear surfaces of the mobile terminal 200 where an AP is located after the AP is operated for 40 minutes on the mobile terminal 200 according to the present disclosure including the metal plate 210 and the heat pipe 230 as a configuration thereof, and a mobile terminal 200 without having them in the related art, respectively, and FIG. 5B is a graph showing temperature distribution over time.

As shown in FIG. 5A, it is seen that the temperature of the mobile terminal 200 of the present disclosure is about 3.2 degrees lower than that of the related art on the front surface, and about 0.7 degrees lower on the rear surface. In addition, as shown in FIG. 5B, as a result of checking temperature distribution over time, it is seen that the temperature measured on the front and rear surfaces of the mobile terminal 200 is lower than that of the related art. This denotes that heat generated from the electronic device 220 is effectively dissipated by the structure of the present disclosure including the metal plate 210 and the heat pipe 230.

FIGS. 6 through 9 are views showing a structure of the mobile terminal 200 according to another embodiment of the present disclosure. Hereinafter, differences from the structure of the mobile terminal 200 of FIG. 4 described above will be mainly described.

Figure 6:
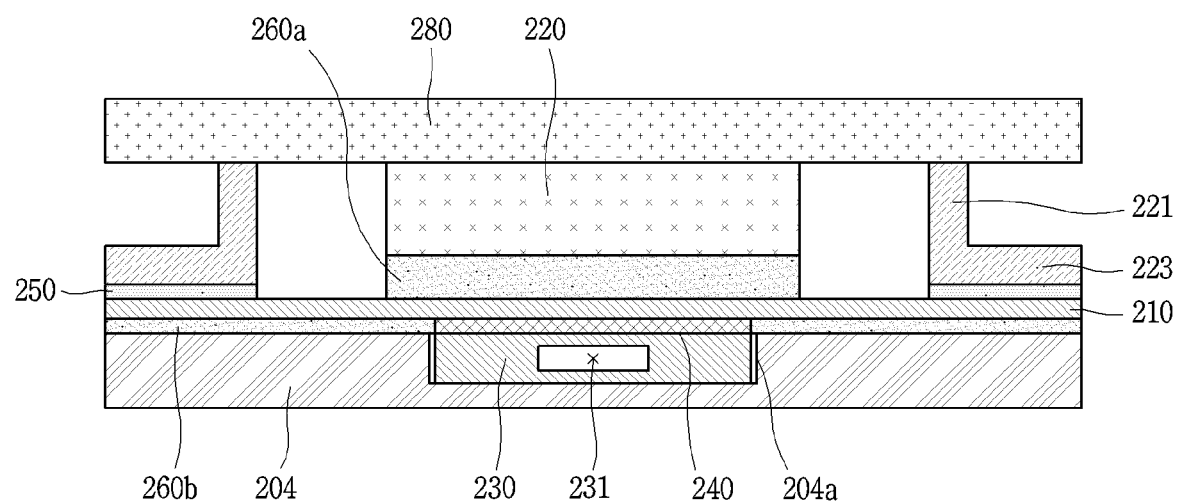
FIG. 6 is a view showing a shape in which an upper surface of a shield can is formed by a metal plate 210.

FIG. 6 shows a shape in which the upper surface 222 of the shield can 223 is formed by the metal plate 210. The sidewall portion 221 of the shield can 223 and the metal plate 210 may be coupled by a conductive tape 250. At this time, for effective coupling between the sidewall portion 221 of the shield can 223 and the metal plate 210, the side wall portion 221 of the shield can 223 may be bent outward to increase its area and then coupled to the metal plate 210.

When the upper surface 222 of the shield can 223 is replaced by the metal plate 210, the metal plate 210 not only receives heat from the first heat transfer member 260a from the electronic device 220, but also serves to seal the shield can 230 so as to shield electromagnetic waves generated from the electronic device 220. Furthermore, since the upper surface 222 of the shield can 223 is not required, an overall thickness of the mobile terminal 200 may be reduced by that thickness.

In addition, although omitted in the drawing, even when the shield can 223 is formed in plurality, the metal plate 210 may be of course provided to cover the upper surfaces 222 of each shield can 223.

Figure 7:
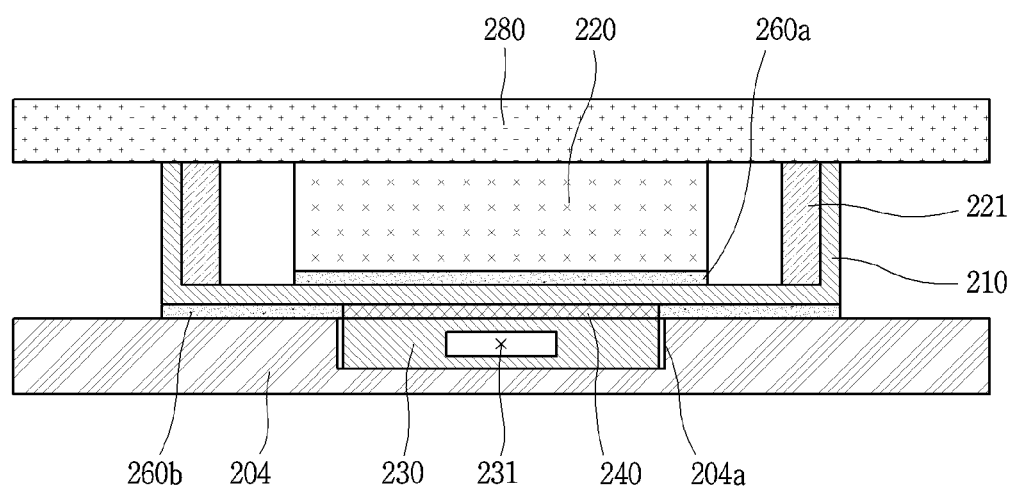
FIG. 7 is a view showing a shape in which a metal plate is coupled to a sidewall portion of the shield can.

FIG. 7 is a view showing a shape in which the metal plate 210 is coupled to the sidewall portion 221 of the shield can 223.

The metal plate 210 is transformed into a shape surrounding the electronic device 220, and positioned at an outside of the sidewall portion 221 of the shield can 223 to be fixed to the circuit board 280. The metal plate 210 may shield electromagnetic waves generated from the electronic device 220 positioned at an inner side of the metal plate 210, and the metal plate 210 may also be brought into contact with the electronic device 220 through the heat transfer member 260a, thereby efficiently transferring heat generated from the electronic device 220 to the heat pipe 230. The metal plate 210 is coupled to the heat pipe 230 by the low-temperature soldering portion 240.

Figure 8:
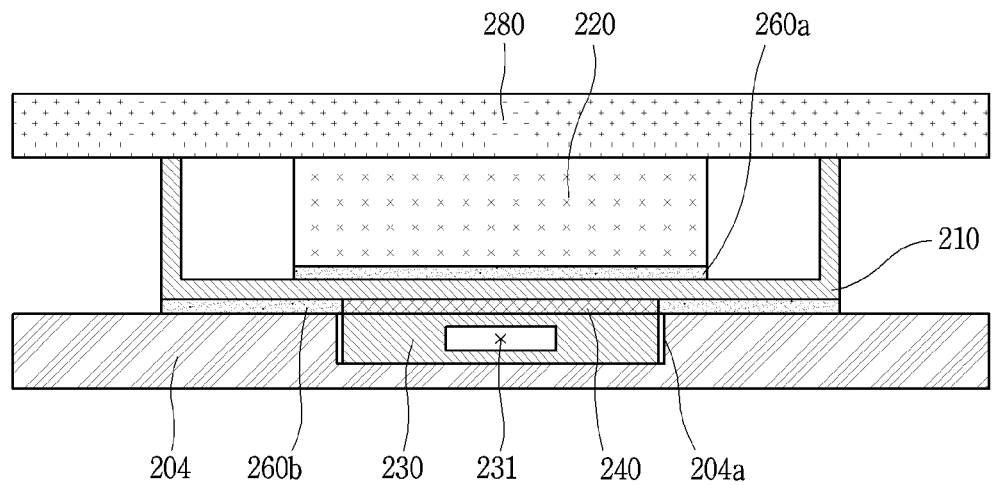
FIG. 8 is a view showing a shape in which a shield can and a metal plate are integrally formed.

FIG. 8 is a view showing a shape in which the shield can 223 and the metal plate 210 are integrally formed. In the case of the present embodiment, in addition to the description of FIG. 6, the metal plate 210 may be configured not only to substitute for the upper surface 222 of the shield can 223, but also to substitute for the entire metal plate 210.

The shield portion 222 (or upper surface) and the sidewall portion 221 of the shield can 223 may be made of a copper alloy, and the upper surface 222 of the shield can 223 may be directly coupled to the heat pipe 230 by the low-temperature soldering portion 240. Here, the metal plate 210 is made of the shape of the shield can 223, and thus it may also be understood that the metal plate 210 is provided on the circuit board 280 by replacing the shield can 223.

Figure 9:
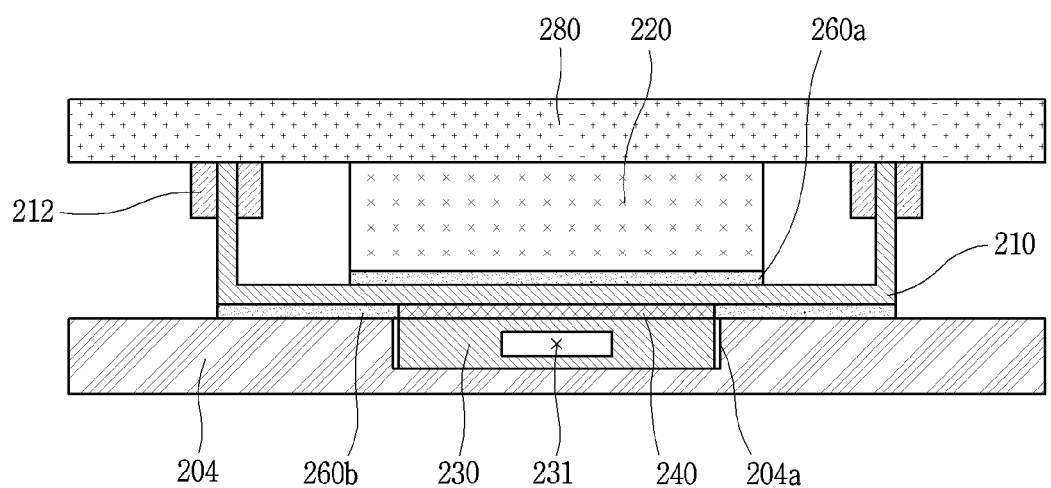
FIG. 9 is a view showing a state in which a shield can and a metal plate are integrally formed.

FIG. 9 is a view showing a shape in which the shield can 223 and the metal plate 210 are integrally formed.

The shield portion 222 (upper surface 222) and the sidewall portion 221 of the shield can 223 may be made of a copper alloy, and the upper surface 222 of the shield can 223 may be directly coupled to the heat pipe 230 by the low-temperature soldering portion 240. The metal plate 210 may be molded into the shape of the shield can 223 to substitute for the the shield can 223, and an adhesion member 212 formed in the shape of a clip is provided on the circuit board 280 at a portion coupled to the metal plate 210, thereby more stably supporting the metal plate 210 formed in the shape of the shield can 223.

FIG. 10 is a view showing a shape of a mobile terminal showing another embodiment of the present disclosure.

In the present embodiment, it is illustrated a structure including a metal plate 310 having a modified structure and a heat pipe 330 provided in contact with the metal plate 310 when a plurality of circuit boards 380 are vertically arranged inside the mobile terminal.

The structure including an electronic device 320, a shield can 323 provided to surround the electronic device 320, a metal plate 310 provided in contact with the shield can 323, and a heat pipe 330 coupled by the metal plate 310 and the low-temperature soldering portion 340 is the same as described above.

A mobile terminal according to the present embodiment may include a first circuit board 381 located with an inner frame 304 for supporting a rear surface of the terminal body, and mounted with the electronic devices 320 on both surfaces thereof, and a second circuit board 382 spaced apart by a predetermined distance in a vertical direction, and disposed in parallel to the first circuit board 381, and mounted with the electronic device 320 on one surface thereof.

An interposer 383 may be positioned between the first circuit board 381 and the second circuit board 382. The interposer 383 serves to electrically connect the first circuit board 381 and the second circuit board 382 arranged vertically. When the interposer 383 is provided between the first circuit board 381 and the second circuit board 382, electromagnetic waves may be shielded through the interposer 383, and thus the electronic device 320 provided between the first circuit board 381 and the second circuit boards 382 may not be provided with an additional shield can 323.

The metal plate 310 may include a vertical portion 311 extended in a direction intersecting the first circuit board 381 and the second circuit board 382 from side portions of the first circuit board 381 and the second circuit board 382, and a horizontal portion 312 bent at both ends of the vertical portion 311 and then extended in contact with the each shield can 323. The horizontal portion 312 is disposed to extend in a direction parallel to the first circuit board 381 and the second circuit board 382.

The heat pipes 330a and 330b are positioned such that one surface thereof is brought into contact with the metal plate 310, and the other surface thereof is brought into contact with the inner frame 304.

The heat pipe 330a, 330b may include a first heat pipe 330a coupled to one side of a vertical portion 311 of the metal plate 310 by one side of a low-temperature soldering portion 340a, and a second heat pipe 330b coupled to one side of a horizontal portion 312 of the metal plate 310 by a low-temperature soldering portion 340b.

The metal plate 310, the first heat pipe 330a, and the second heat pipe 330b may be integrally formed.

The first heat pipe 330a may be coupled to the vertical portion 311 of the metal plate 310 by the low-temperature soldering portion 340a. The first heat pipe 330a may be formed to be coupled through the inner frame 204 and the heat transfer member 360b.

Heat generated by the electronic devices 320 mounted on both sides of the first circuit board 381 may be transferred through the vertical portion 311 of the metal plate 310 positioned in contact with the sidewall portion 321 of the shield can 323. The vertical portion 311 of the metal plate 310 is coupled to the first heat pipe 330a through the low-temperature soldering portion 340a, and the first heat pipe 330a is brought into contact with the inner frame 304a through a heat transfer member 360a, and thus heat generated from the electronic device 320 may be dissipated to the inner frame 304 through the metal plate 310 and the first heat pipe 330a.

The second heat pipe 330b may be coupled to the horizontal portion 312 of the metal plate 310 through the low-temperature soldering portion 340b, and heat generated from the electronic device 320 may be transferred to the heat pipe 330b through the metal plate 310. The second heat pipe 330b is accommodated in a groove portion 304a formed in the inner frame 304, and brought into contact with the inner frame 304, and thus heat generated from the electronic device 320 may be transferred up to the inner frame 304.

Inside the first heat pipe 330a and the second heat pipe 330b, passages 331a, 331b capable of accommodating working fluid may be formed. The working fluid is accommodated in each of the passages 331a, 331b, and a phase change occurs when the working fluid increases in temperature, thereby allowing heat to be absorbed from the electronic device 320. Furthermore, since the first heat pipe 330a and the second heat pipe 330b are respectively brought into contact with one side of the inner frame 304, heat generated from the electronic device 320 may be transferred up to the inner frame 304.

Figure 11:
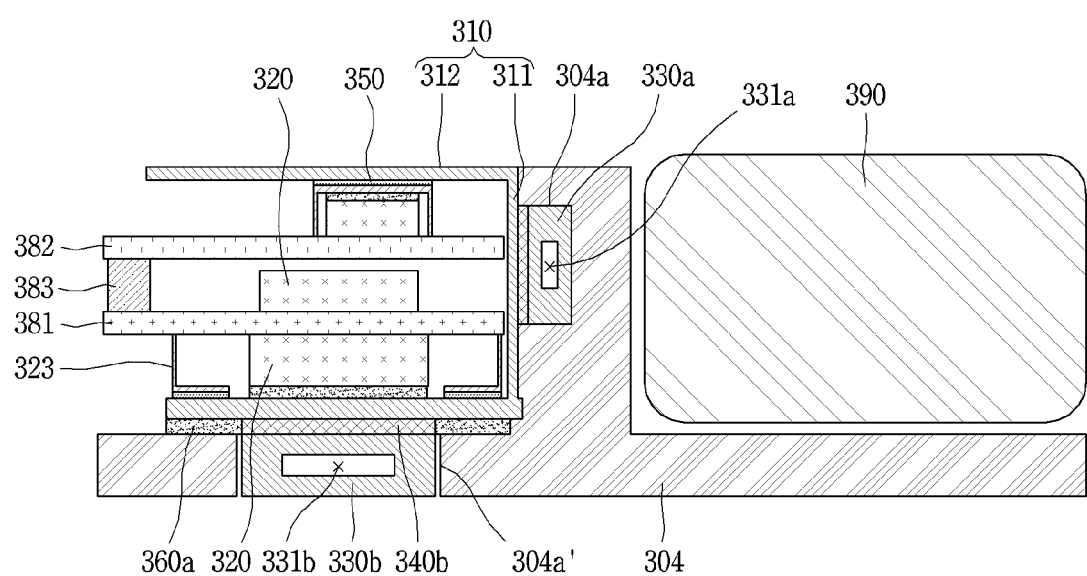
FIG. 11 is a view showing a shape of a mobile terminal showing an embodiment different from FIG. 10.

FIG. 11 is a view showing a shape of the mobile terminal 300 showing an embodiment different from FIG. 10.

The first heat pipe 330a and the second heat pipe 330b may be configured to be inserted into groove portions 304a, 304a' formed in the inner frame 304, respectively. The first heat pipe 330a coupled to the vertical portion 311 of the metal plate 310 by the low-temperature soldering portion 340a may be positioned to be accommodated in the groove portion 304a formed in the inner frame 304. In this case, it may be possible to obtain an effect of increasing a contact area with the inner frame 304 without increasing an overall length of the mobile terminal 300 by a width of the first heat pipe 330a, thereby achieving effective heat transfer.

The second heat pipe 330b is configured to be coupled to the horizontal portion 312 of the metal plate 310 by the low-temperature soldering portion 340b, and is positioned to be accommodated in the groove portion 304a' formed in the inner frame 304. When the second heat pipe 330b is accommodated in the groove portion 304a' formed in the inner frame 304, a contact area between the second heat pipe 330b and the inner frame 304 may be increased to enable effective heat transfer, thereby limiting an increase in a total thickness of the mobile terminal 300 by a thickness of the second heat pipe 330b.

The foregoing embodiments are merely exemplary and are not to be considered as limiting the present disclosure. The scope of the invention should be determined by reasonable interpretation of the appended claims and all changes that come within the equivalent scope of the invention are included in the scope of the invention.

The present disclosure may be applicable and applied to a mobile terminal in which it matters to secure heat dissipation performance.

What is claimed is:

1. A mobile terminal, comprising:
   a terminal body;
   a circuit board provided inside the terminal body;

an electronic device mounted on one surface of the circuit board;

a shield can provided on the circuit board to surround the electronic device so as to shield electromagnetic waves generated from the electronic device;

a metal plate coupled to the shield can and composed of copper or a copper alloy;

a first heat transfer member disposed between the electronic device and the metal plate and configured to occur a phase change to a liquid phase when reaching a constant temperature and fill an air layer between the electronic device and the metal plate and contact both the electronic device and the metal plate;

a heat pipe positioned to face the shield can with the metal plate interposed therebetween, and provided with a passage to accommodate fluid in a central portion thereof; and a second heat transfer member disposed between the metal plate and the heat pipe, wherein the metal plate and the heat pipe are integrally formed by a soldering portion to transfer heat generated from the electronic device to the heat pipe through the metal plate, and the soldering portion is disposed on a same plane as the second heat dissipation transfer member, wherein the soldering portion is disposed at a central region relative to the second heat transfer member that is disposed at left and right lateral sides of the soldering portion, wherein the first heat transfer member is disposed in a central region of a layer that is in a plane that is different than the plane of the soldering portion and the second heat dissipation transfer member;

wherein the second heat transfer member is configured to occur a phase change to a liquid phase when reaching a constant temperature and fill an air layer between the metal plate and the heat pipe and contact both the metal plate and the heat pipe.

2. The mobile terminal of claim 1, wherein an upper surface of the shield can is integrally formed with the metal plate to seal the shield can.

3. The mobile terminal of claim 1, wherein the metal plate is configured to constitute part of an upper surface of the shield can.

4. The mobile terminal of claim 1, wherein the shield can and the metal plate are integrally formed.

5. The mobile terminal of claim 4, wherein the circuit board is provided with an adhesion member for fixing the metal plate to couple to the metal plate.

6. The mobile terminal of claim 1, further comprising:

an inner frame provided inside the terminal body to support a rear surface of the terminal body, wherein the heat pipe is positioned in contact with the inner frame.

7. The mobile terminal of claim 6, wherein a groove portion is formed in the inner frame to accommodate the heat pipe.

* * * * *